(12) United States Patent
Li

(10) Patent No.: US 12,132,106 B2
(45) Date of Patent: Oct. 29, 2024

(54) SEMICONDUCTOR DEVICE AND METHOD OF FABRICATING THE SAME

(71) Applicant: UNITED MICROELECTRONICS CORP., Hsin-Chu (TW)

(72) Inventor: Shin-Hung Li, Nantou County (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 388 days.

(21) Appl. No.: 17/688,821

(22) Filed: Mar. 7, 2022

(65) Prior Publication Data
US 2023/0253496 A1 Aug. 10, 2023

(30) Foreign Application Priority Data
Feb. 10, 2022 (CN) ............ 202210124091.4

(51) Int. Cl.
*H01L 31/109* (2006.01)
*H01L 29/08* (2006.01)
*H01L 29/423* (2006.01)
*H01L 29/78* (2006.01)
*H01L 31/0328* (2006.01)
*H01L 31/072* (2012.01)

(52) U.S. Cl.
CPC ...... *H01L 29/7827* (2013.01); *H01L 29/0847* (2013.01); *H01L 29/42392* (2013.01)

(58) Field of Classification Search
CPC ............ H01L 29/7827; H01L 29/0847; H01L 29/42392
USPC ....................................................... 257/192
See application file for complete search history.

(56) References Cited

U.S. PATENT DOCUMENTS

| 10,090,410 B1 | 10/2018 | Chi et al. | |
| 2017/0194320 A1* | 7/2017 | Chen | H01L 29/42368 |
| 2017/0352742 A1* | 12/2017 | Cheng | H01L 29/0657 |

* cited by examiner

*Primary Examiner* — Theresa T Doan
(74) *Attorney, Agent, or Firm* — Winston Hsu

(57) ABSTRACT

A semiconductor device and method of fabricating the same, the semiconductor device includes a substrate, a first transistor and a second transistor. The substrate includes a high-voltage region and a low-voltage region. The first transistor is disposed on the HV region, and includes a first gate dielectric layer disposed on a first base, and a first gate electrode on the first gate dielectric layer. The first gate dielectric layer includes a composite structure having a first dielectric layer and a second dielectric layer stacked sequentially. The second transistor is disposed on the LV region, and includes a fin shaped structure protruded from a second base on the substrate, and a second gate electrode disposed on the fin shaped structure. The first dielectric layer covers sidewalls of the second gate electrode and a top surface of the first dielectric layer is even with a top surface of the second gate electrode.

10 Claims, 5 Drawing Sheets

SEMICONDUCTOR DEVICE AND METHOD OF FABRICATING THE SAME

BACKGROUND OF THE INVENTION

1. Field of the Invention

The present disclosure relates generally to a semiconductor device and a method of fabricating the same, and more particularly to a semiconductor device including a high-voltage (HV) component, and a low-voltage (LV) component together and a method of fabricating the same.

2. Description of the Prior Art

According to the current semiconductor technology, it is able to integrate control circuits, memories, low-voltage operating circuits, and high-voltage operating circuits and components on a single chip together, thereby reducing costs and improving operating efficiency. High-voltage components such as vertical double-diffusion metal-oxide-semiconductor (VDMOS), insulated gate bipolar transistor (IGBT), lateral-diffusion metal-oxide-semiconductor (LDMOS), etc. fabricated in a chip are used in various applications due to their better power switching efficiency. Those skilled in the art should know that the aforementioned high-voltage components are often required to withstand higher breakdown voltages and operate at lower resistance values.

In addition, as the size of semiconductor components becomes smaller and smaller, there are many improvements in the process steps of forming transistors to fabricate transistors with small volume and high quality. For example, non-planar field effect transistors, such as fin field-effect transistors (FinFETs), have replaced planar field effect transistors as the current mainstream development trend. However, as the size of devices continues to decrease, it becomes more difficult to dispose high-voltage components and fin field-effect transistors on the same semiconductor device together, and the processes of forming the semiconductor device also faces many limitations and challenges.

SUMMARY OF THE INVENTION

An object of the present disclosure is to provide a semiconductor device, where active areas of a high-voltage component is disposed within a periphery region of a low-voltage component (for example the fin field-effect transistor), and a gate dielectric layer of the high-voltage component is partially embedded in an interlayer dielectric layer (ILD) of the low-voltage component. Therefore, the high-voltage component and the low-voltage component may substantially obtain a same height, to avoid the obvious height differences between various regions of the semiconductor device. Also, shallow trench isolations formed within a high-voltage region and a low-voltage region may obtain the same depth, to avoid serious loading effecting occurred within the semiconductor device, so as to improve the device functions and the performances.

An object of the present disclosure is to provide a method of fabricating a semiconductor device, which integrates the fabrications of a high-voltage component and a low-voltage component by defining active areas of the high-voltage component while defining fin shaped structures of the low-voltage component, so as to form the high-voltage component and the low-voltage component through a simplified process flow.

To achieve the aforementioned objects, the present disclosure provides a semiconductor device including a substrate, a first transistor, and a second transistor. The substrate includes a high-voltage region and a low-voltage region. The first transistor is disposed in the high-voltage region and includes a first gate dielectric layer disposed on a first plane of the substrate, and a first gate electrode disposed on the first plane of the first gate dielectric layer, wherein the first gate dielectric layer includes a composite structure including a first dielectric layer and a second dielectric layer stacked from bottom to top. The second transistor is disposed on the low-voltage region and includes a plurality of fin shaped structures protruded from a second plane on the substrate and a second gate electrode disposed on the fin shaped structures to cross thereto. The first dielectric layer covers sidewalls of the second gate electrode and a top surface of the first dielectric layer is even with a top surface of the second gate electrode.

To achieve the aforementioned objects, the present disclosure provides a method for fabricating a semiconductor device including the following steps. Firstly, a substrate having a low-voltage (LV) region and a high-voltage (HV) region is provided. Then, a first transistor is formed on the HV region, and the first transistor includes a first gate dielectric layer disposed on a first plane of the substrate, and a first gate electrode disposed on the first plane of the first gate dielectric layer, wherein the first gate dielectric layer includes a composite structure including a first dielectric layer and a second dielectric layer stacked from bottom to top. Next, a second transistor is formed on the LV region, and the second transistor includes a plurality of fin shaped structures protruded from a second plane on the substrate, and a second gate electrode disposed on the fin shaped structure. The first dielectric layer covers sidewalls of the second gate electrode and a top surface of the first dielectric layer is even with a top surface of the second gate electrode.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

FIG. 1 to FIG. 9 illustrates schematic diagrams of a method of fabricating a semiconductor device according to a first embodiment of the present disclosure, in which:

FIG. 1 is a schematic cross-sectional view of a semiconductor device while performing a sidewall self-aligned double patterning process;

FIG. 2 is a schematic cross-sectional view of a semiconductor device after forming a mask layer;

FIG. 3 is a schematic cross-sectional view of a semiconductor device after forming a dielectric layer;

FIG. 4 is a schematic cross-sectional view of a semiconductor device after forming a contact etching stop material layer;

FIG. 5 is a schematic cross-sectional view of a semiconductor device after performing an etching process;

FIG. 6 is a schematic cross-sectional view of a semiconductor device after forming an interlayer dielectric layer;

FIG. 7 is a schematic cross-sectional view of a semiconductor device after performing a replacement of metal gate process;

FIG. 8 is a schematic cross-sectional view of a semiconductor device after a gate stack; and FIG. 9 is a schematic cross-sectional view of a semiconductor device after forming a gate electrode of a high-voltage component.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

The present disclosure relates to a method of fabricating a semiconductor device, which integrates the fabrication methods of a high-voltage (HV) component, and a low-voltage (LV) component. The high-voltage component may refer to semiconductor transistors with an initial voltage between 10 volts and 20 volts, and the low-voltage component may refer to semiconductor transistors with an initial voltage between 0.5 volt and 1 volt, but not limited thereto. Please refer to FIG. 1 to FIG. 9, which are schematic diagrams of a method of fabricating a semiconductor device 300 according to the first embodiment of the present disclosure.

Figure 1:
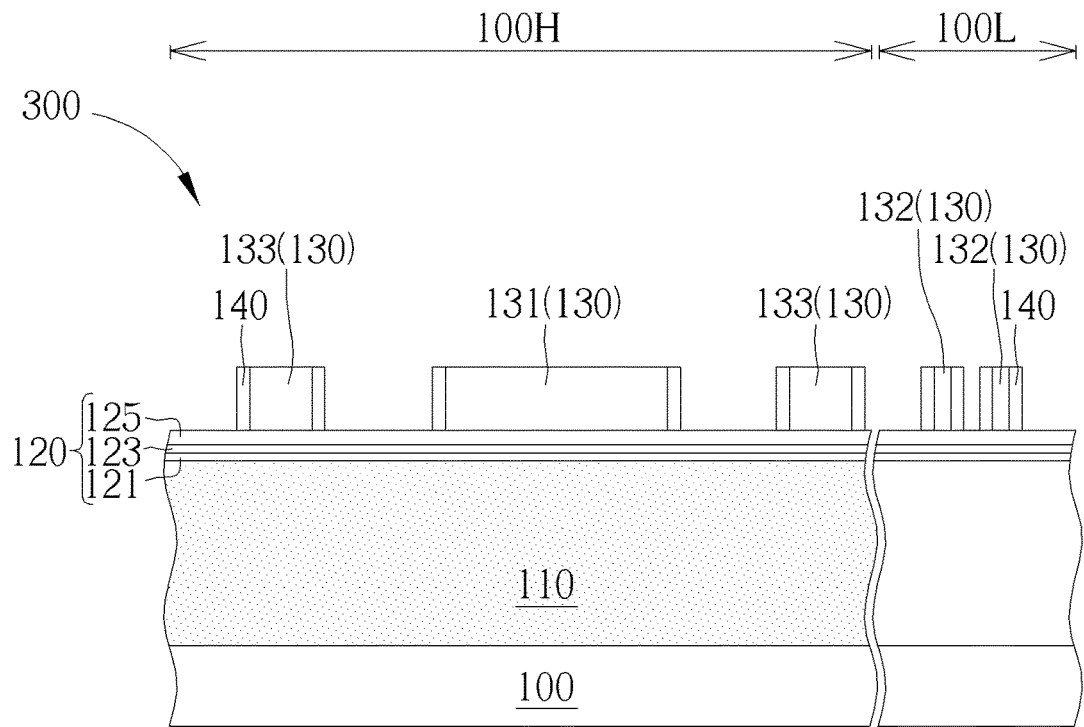

Firstly, please refer to FIG. 1, a substrate 100 is provided, which includes for example a silicon substrate, an epitaxial silicon substrate, a silicon-containing substrate, or a silicon-on-insulator (SOI) substrate, but not limited thereto. The substrate 100 at least includes a first region 100H and a second region 100L, wherein the first region 100H may be used as a high-voltage region (HV region) of the substrate 100 for forming high-voltage components such as semiconductor transistors suitable for high-voltage operation, and the second region 100L may be used as a low-voltage region (LV region) of the substrate 100 for forming low-voltage components such as semiconductor transistors suitable for low-voltage operation. In the present embodiment, another region such as a medium-voltage region (MV region) may be further disposed between the first region 100H and the second region 100L, but is not limited thereto.

It is noted that, the first region 100H of the substrate 100 further includes a high-voltage deep well region 110, and the formation of the high-voltage deep well region 110 includes but is not limited to the following process. Firstly, a mask structure (not shown in the drawings) is formed on a substrate 100 for covering the second region 100L of the substrate 100 and exposing the first region 100H of the substrate 100. Next, an ion implantation process is performed on the first region 100H of the substrate 100 through relative higher implantation energy, to form the high-voltage deep well region 110 within the first region 100H of the substrate 100. Accordingly, the high-voltage deep well region 110 may extend downwardly from a topmost surface within the first region 100H of the substrate 100 into the substrate 100, as shown in FIG. 1, but is not limited thereto. In one embodiment, the high-voltage deep well region 110 includes a first conductive type, for example being a P-type doped region, but not limited thereto.

Then, further in view of FIG. 1, a sidewall self-aligned double patterning process (SADP) is performed on the substrate 100, and which includes but is not limited to the following process. Firstly, a mask structure 120 is formed on the substrate 100, and a plurality of mandrels 130 is formed on the mask structure 120 through a photolithography and etching process, with the mask structure 120 further including a first mask layer 121 (for example including a silicon oxide layer), a second mask layer 123 (for example including a silicon nitride layer), and a third mask layer 125 (for example including a silicon oxide layer) stacked from bottom to top on the substrate. It is noted that, in order to form a low-voltage component with a relative higher integrity in the second region 100L (namely, the LV region) through the SADP process, the mandrels 130 further includes a plurality of third mandrels 132 formed within the second region 100L of the substrate 100, with the third mandrels 132 having a relative smaller pitch and a relative smaller dimension. Furthermore, the mandrels 130 further includes a first mandrel 131 and a plurality of second mandrels 133 formed within the first region 100H (namely, the HV region), with the first mandrel 131 and the second mandrels 133 having a relative greater pitch and a relative greater dimension. The first mandrel 131 is for example formed between two of the second mandrels 133, and which is spaced apart by the same pitch from the second mandrels 133 adjacent two sides thereof, as shown in FIG. 1. Next, a deposition process and an etching process are sequentially performed to form a spacer 140 on sidewalls of each of the third mandrels 130, as shown in FIG. 1.

Figure 2:
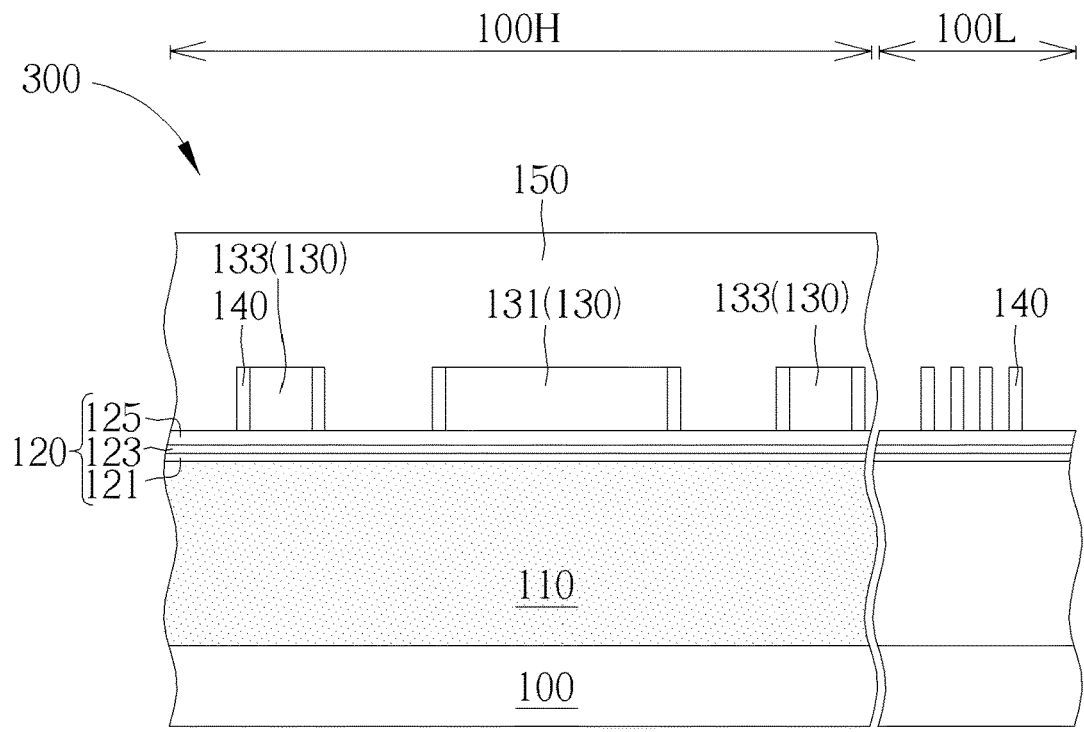

As shown in FIG. 2, a mask layer 150 for example including a photoresist material is formed on the substrate 100, for covering the first region 100H of the substrate 100 and exposing the second region 100L of the substrate 100, and an etching process is performed through the mask layer 150, to remove the third mandrels 132 disposed within the second region 100L, and to remain the spacer 140 for defining the location of the fin shaped structures formed subsequently. Next, the mask layer 150 is completely removed, and another etching process is performed through the first mandrel 131, the second mandrels 133, and the spacer 140 disposed within the first region 100H, and the spacer 140 disposed within the second region 100L, to simultaneously transfer the patterns of the first mandrel 131, the second mandrels 133, and the spacer 140 within the first region 100H into the mask structure 120 and the substrate 100 underneath, to define a plurality of active areas 101, 103 and relative lower planes 102 therebetween, wherein the active area 101 is formed between two active areas 103. Meanwhile, the patterns of the spacer 140 within the second region 100L are also transferred into the mask structure 120 and the substrate 100 underneath, to form a plurality of fin shaped structures 105, and a plurality of planes 104 between the fin shaped structures 105 in the second region 100L of the substrate 100. In other words, each of the fin shaped structures 105 is protruded from the planes 104 of the substrate 100, and the planes 104 within the second region 100L are coplanar with the planes 102 within the first region 100H, and planes 101a, 103a at the top of each of the active areas 101, 103 are also coplanar with the top surfaces of the fin shaped structures 105, as shown in FIG. 3.

Figure 3:
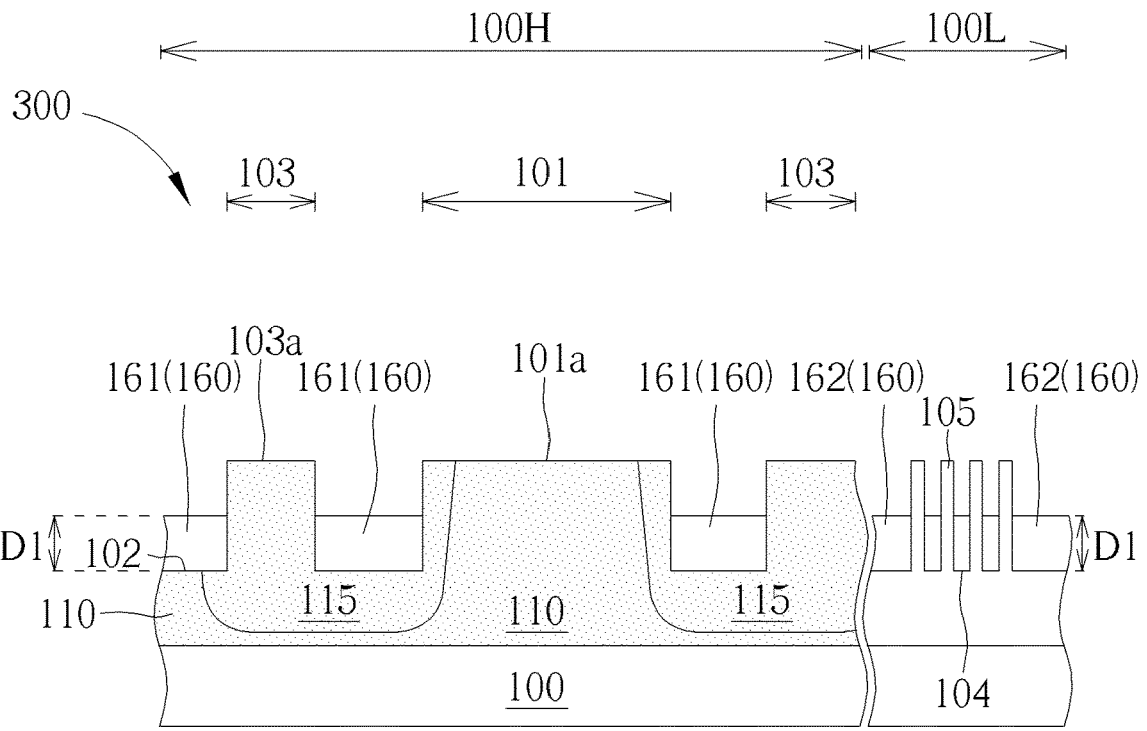

Then, further in view of FIG. 3, a deposition process of a dielectric material is firstly performed, a planarization process is next performed on the dielectric material by using the mask structure 120 as an etching stop layer, and an etching bask process is then performed to partially remove the dielectric material to expose an upper portion of each of the active areas 101, 103 within in the first region 100H, and to expose an upper portion 105a of each of the fin shaped structures 105 within the second region 100L. Accordingly, the remain portions of the dielectric material may therefore form a plurality of shallow trench isolations 160 in the substrate 100, to surround the active areas 101, 103 within the first region 100H, and the fin shaped structures 105 within the second region 100L, respectively. After that, the mask structure 120 is completely removed. It is noted that, the planes 101a, 103a at the top of each of the active areas 101, 103 and the top surfaces of the fin shaped structures 105 are evened with each other, and also, a shallow trench isolation 161 disposed within the first region 100H and a shallow trench isolation 162 disposed within the second region 100L may have the same depth. In addition, another ion implantation may be performed then on the first region 100H of the substrate 100 through another mask layer (not shown in the drawings), to form high-voltage doped regions 115 in a portion of the active areas 101, and the active areas 103. The high-voltage doped regions 115 are completely formed within the high-voltage deep well region 110, and which may include the same conductive type with the high-voltage deep well region 110, for example both being a P-type doped region or a N-type doped region, and include a relative higher doped concentration than that of the high-voltage deep well region 110. In this way, the high-voltage doped regions 115 may be served as source/drain regions of the high-voltage component in the subsequent processes.

Figure 4:
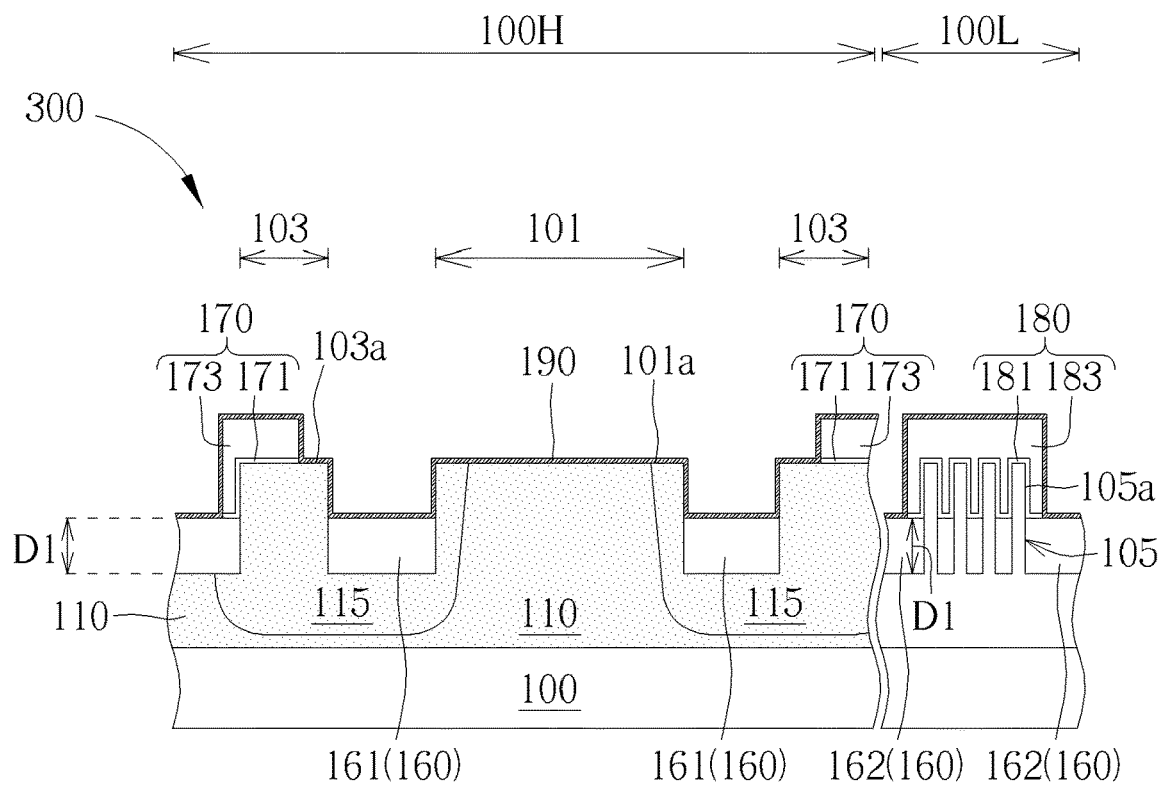

As shown in FIG. 4, a plurality of gate structures 170, 180 are formed on the exposed upper portion of each active area 103 and on the exposed upper portion 105a of each fin shaped structure 105, respectively. Precisely speaking, each of the gate structures 170 is disposed on each active area 103 to partially cover the planes 103a and a sidewall at one side of each active area 103, and the gate structure 180 is disposed on at least one of the fin shaped structures 105, to cross over the upper portion 105a of the corresponding fin shaped structures 105. In one embodiment, the formations of the gate structures 170, 180 include but are not limited to the following process. Firstly, a gate dielectric material layer (not shown in the drawings, for example including a material like silicon oxide) and a gate electrode layer (not shown in the drawings, for example including a material like polysilicon) are sequentially formed on the substrate 100, and the gate electrode layer and the gate dielectric material layer are patterned to form the gate structures 170, 180. Then, each of the gate structures 170, 180 may include a gate dielectric layer 171, 181 and a gate electrode 173, 183 stacked from bottom to top, wherein the gate dielectric layer 181 directly contacts the surfaces of the upper portions 105a of the fin shaped structures 105, and the gate electrode 183 is formed on the gate dielectric layer 181 to cross over the upper portions 105a of the fin shaped structures 105, thereby forming a poly gate structure. Furthermore, after forming the poly gate structure, a fin recess process, an epitaxial growth process, and a forming process of source/drain regions of the low-voltage component may be formed sequentially due to practical requirements, and all details of the aforementioned processes will not be further described hereinafter.

Then, further in view of FIG. 4, a contact etching stop material layer 190 is formed on the substrate 100 to conformally cover on the shallow trench isolations 160, each of the active areas 101, 103, the fin shaped structures 105, and each of the gate structures 170, 180. In one embodiment, the contact etching stop material layer 190 for example includes a material like silicon nitride, silicon oxynitride, or silicon carbonitride, but is not limited thereto.

Figure 5:
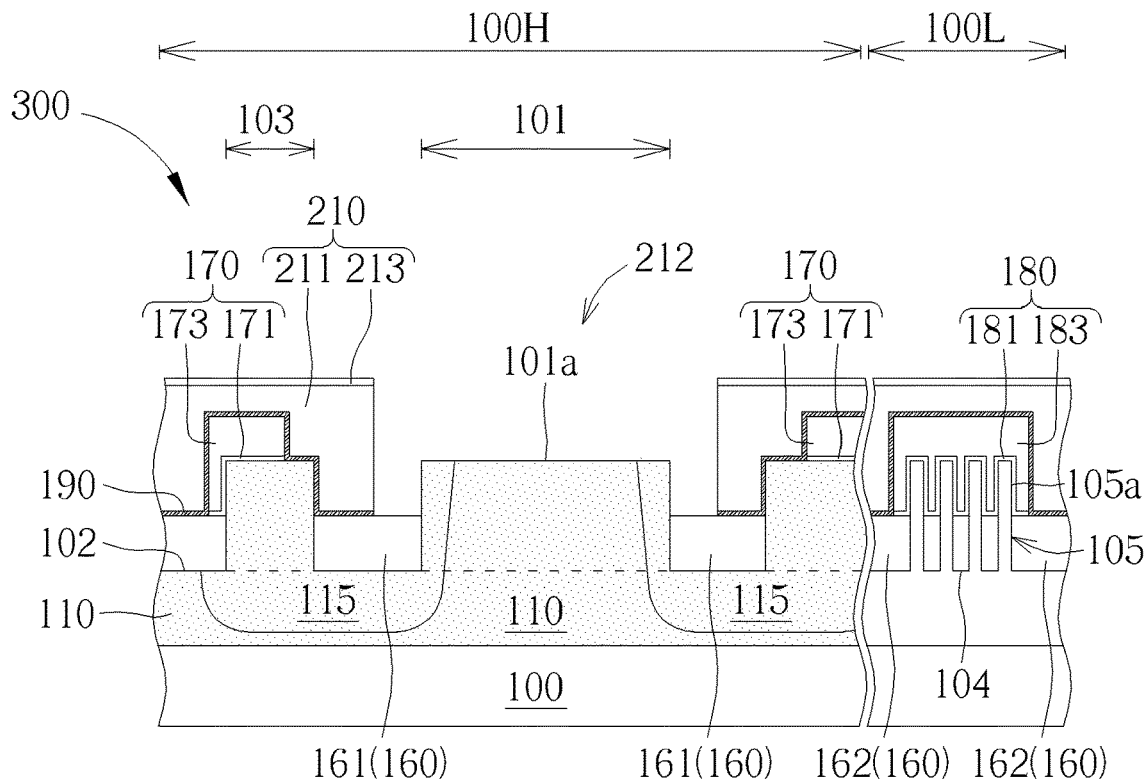

As shown in FIG. 5, a patterning process of the contact etching stop material layer 190 is performed. Firstly, a mask structure 210 is formed on the substrate 100, and which includes an opening 212 for exposing the active area 101 and a portion of the shallow trench isolation 161 at two sides of the active area 101 within the first region 100H. In one embodiment, the mask structure 210 for example includes a first mask layer 211 such as including an organic dielectric material with better filling ability, and a second mask layer 213 such as including a material like silicon nitride stacked from bottom to top, but is not limited thereto. Then, an etching process is performed through the mask structure 210 to partially remove the contact etching stop material layer 190, and to expose the plane 101a at the top of the active area 101 and the portion of the shallow trench isolations 161 at two sides of the active area 101. The plane 101a is obvious higher than the planes 102 between each of the active areas 101, 103, and the planes 104 between each of the fin shaped structures 105. In addition, people well skilled in the art should fully realize that, while performing the patterning process of the contact etching stop material layer 190, a plurality of contact openings (not shown in the drawings) may also be formed within the second region 100H of the substrate. For example, the mask structure 210 may further include other openings (not shown in the drawings) for exposing a portion (not shown in the drawings) of the fin shaped structures 105, and a metal silicidation process may be formed on the portion of the fin shaped structures 105 in the subsequent process to form a plurality of plugs (not shown in the drawings).

Figure 6:
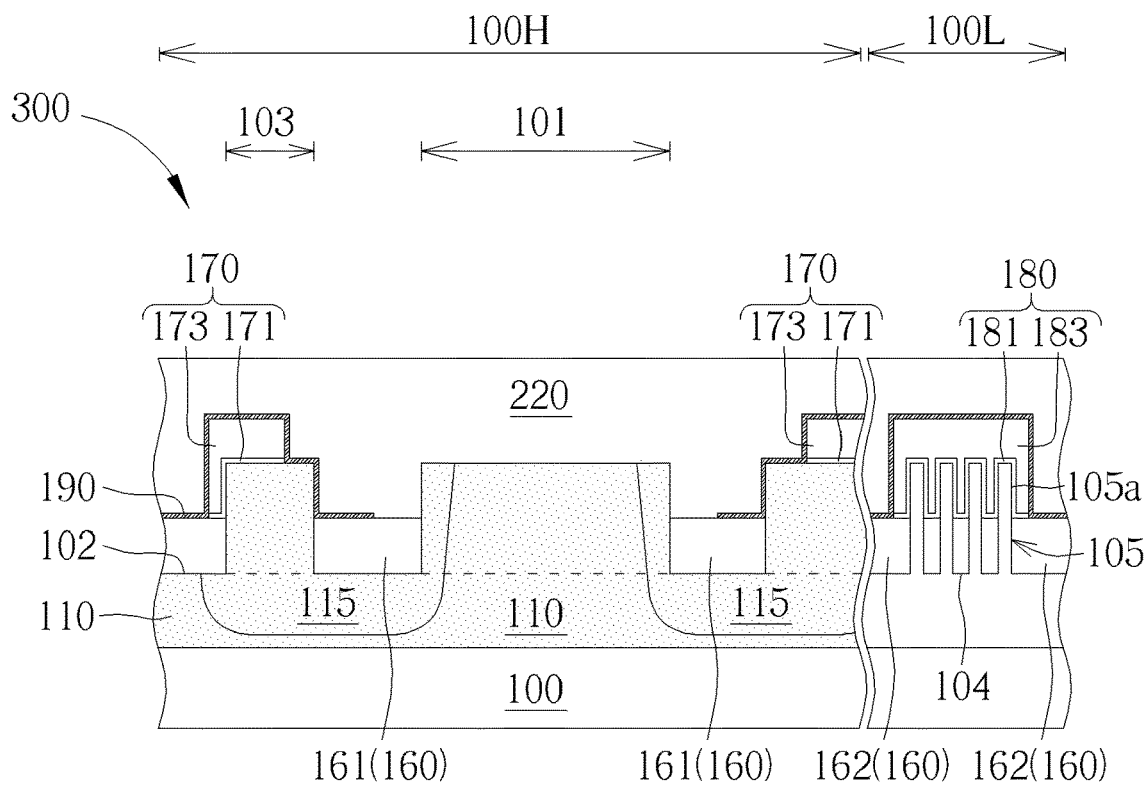

As shown in FIG. 6, after completely removing the mask structure 210, a deposition process such as a flowable chemical vapor deposition (FCVD) process is performed, to form a interlayer dielectric material layer 220 on the substrate 100, wherein the interlayer dielectric material layer 220 may entirely cover the shallow trench isolations 160, each of the active areas 101, 103, the fin shaped structures 105, and each of the gate structures 170, 180. In one embodiment, the interlayer dielectric material layer 220 for example includes a material like silicon oxide, but is not limited thereto.

Figure 7:
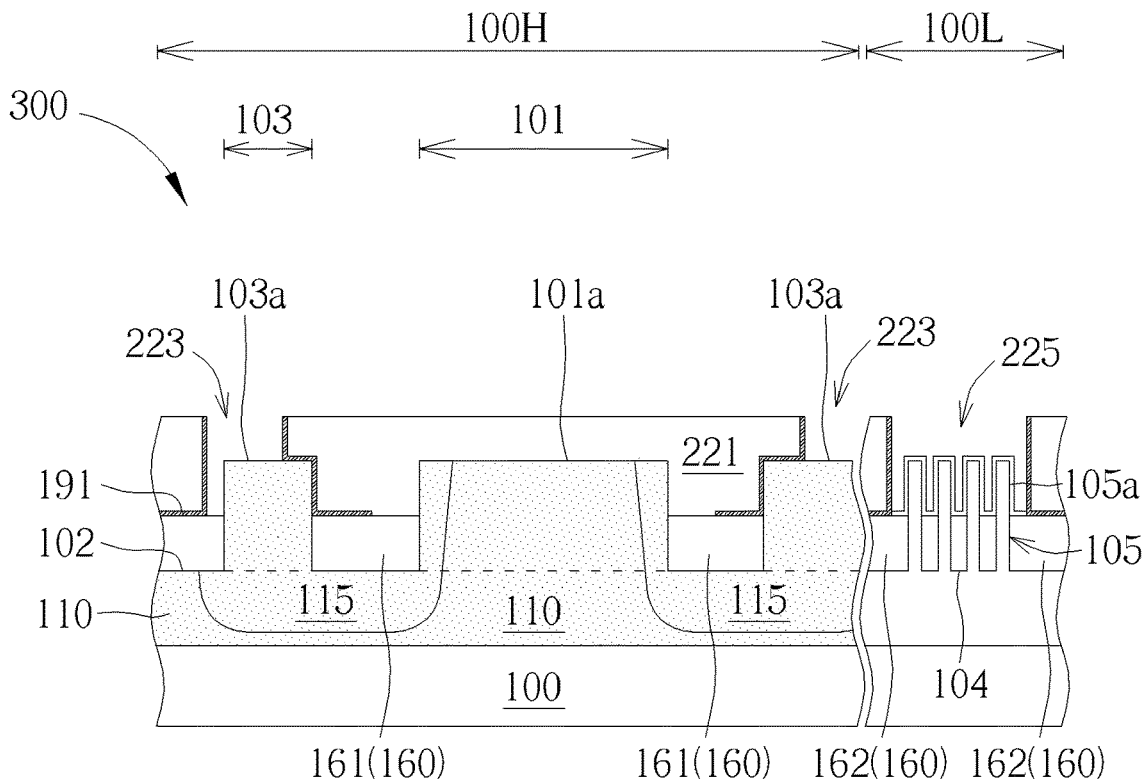

As shown in FIG. 7, a replacement of metal gate (RMG) process is performed, and which includes but not limited to the following process. Firstly, a planarization process such as a chemical mechanical polishing/planarizing process (CMP) is performed to partially remove the interlayer dielectric material layer 220 till partially exposing the contact etching strop material layer 190, and the contact etching strop material layer 190 covered on the top surfaces of the gate structures 170, 180 are removed, thereby forming a contact etching stop layer (CESL) 191 and a first dielectric layer 221 stacked on the contact etching stop layer 191. It is noted that, the first dielectric layer 221 may be serve as an interlayer dielectric layer (ILD) of the semiconductor device 300, so that, the top surface of the first dielectric layer 221 may be flushed with the top surfaces of the gate structures 170, 180. Then, the gate structures 170, 180 are completely removed to form a plurality of gate trenches in the first dielectric layer 221, including two gate trenches 223 within the first region 100H for exposing the planes 103 at the top of the active areas 103 respectively, and a gate trench 225 within the second region 100L for exposing the upper portions 105a of the fin shaped structure 105, as shown in FIG. 7. It is also noted that, the sidewalls at two sides of each of the gate trenches 223, 225 are covered by the contact etching stop layer 191, as shown in FIG. 7.

Figure 8:
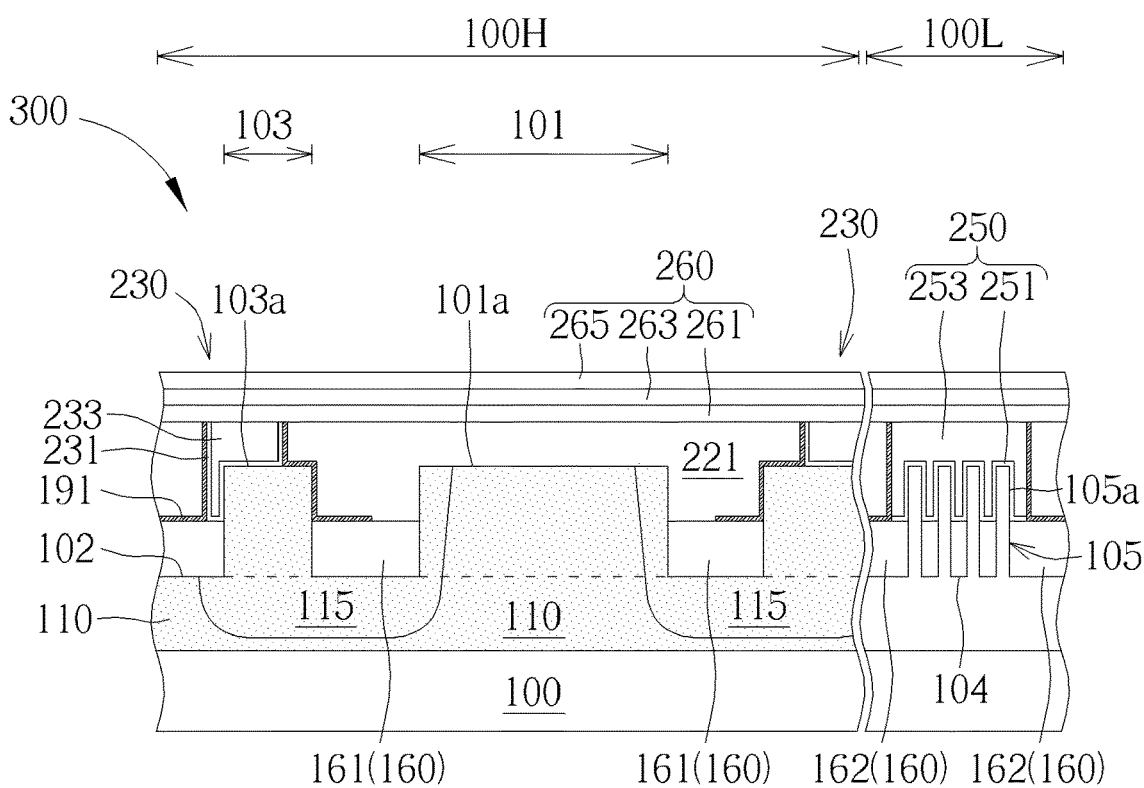

Then, as shown in FIG. 8, a plurality of gate dielectric layers 231, 251 for example including a high dielectric constant (high-k) material like hafnium oxide ($HfO_2$), hafnium silicon oxide ($HfSiO_4$), or hafnium silicon oxynitride (HfSiON), and a plurality of gate electrodes 233, 253 for example including a low resistant metal material like aluminum (Al), titanium (Ti), tantalum (Ta), or tungsten (W), are sequentially formed in each of the gate trenches 223, 225, but not limited thereto. Accordingly, the gate dielectric layer 231 and the gate electrode 233 stacked from bottom to top may fill up each of the gate trenches 223, forming transistors 230 within the first region 100H thereby. On the other hand, the gate dielectric layer 251 and the gate electrode 253 stacked form bottom to top may fill up the gate trench 225, forming a transistor 250 within the second region 100L thereby. With these arrangements, each of the transistors 230, 250 may be includes a metal gate, and which is surrounded by the contact etching stop layer 191 and the first dielectric layer 221, with the contact etching stop layer 191 being disposed between each of the gate electrodes 233, 253 and the first dielectric layer 211, as shown in FIG. 8. The transistor 250 may be served as a fin field-effect transistor because the gate electrode 253 of the transistor 250 are disposed across the upper portions 105a of the fin shaped structures 105, so as to be used as a low-voltage transistor for low-voltage operation. On the other hand, the transistors 230 may be used as dummy gates, or suitable for other voltage ranges, but not limited thereto.

Following these, further in view of FIG. 8, a gate stack 260 is formed on the substrate 100, and which includes a second dielectric layer 261, a conductive layer 263 for example including a material like polysilicon or titanium nitride (TiN), and a capping layer 265 for example including a material like silicon nitride, stacked from bottom to top on the substrate 100, to entirely cover the first dielectric layer 221, and the transistors 230, 250 underneath. It is noted that, the second dielectric layer 261 for example includes a low dielectric constant (low-k) material like tetraethoxysilane (TEOS), to directly cover on the first dielectric layer 221 and each of the transistors 230, 250 underneath for protecting and preventing each of the transistors 230, 250 (the gate electrodes 233, 253 in particular) from being affected in the subsequent processes.

Figure 9:
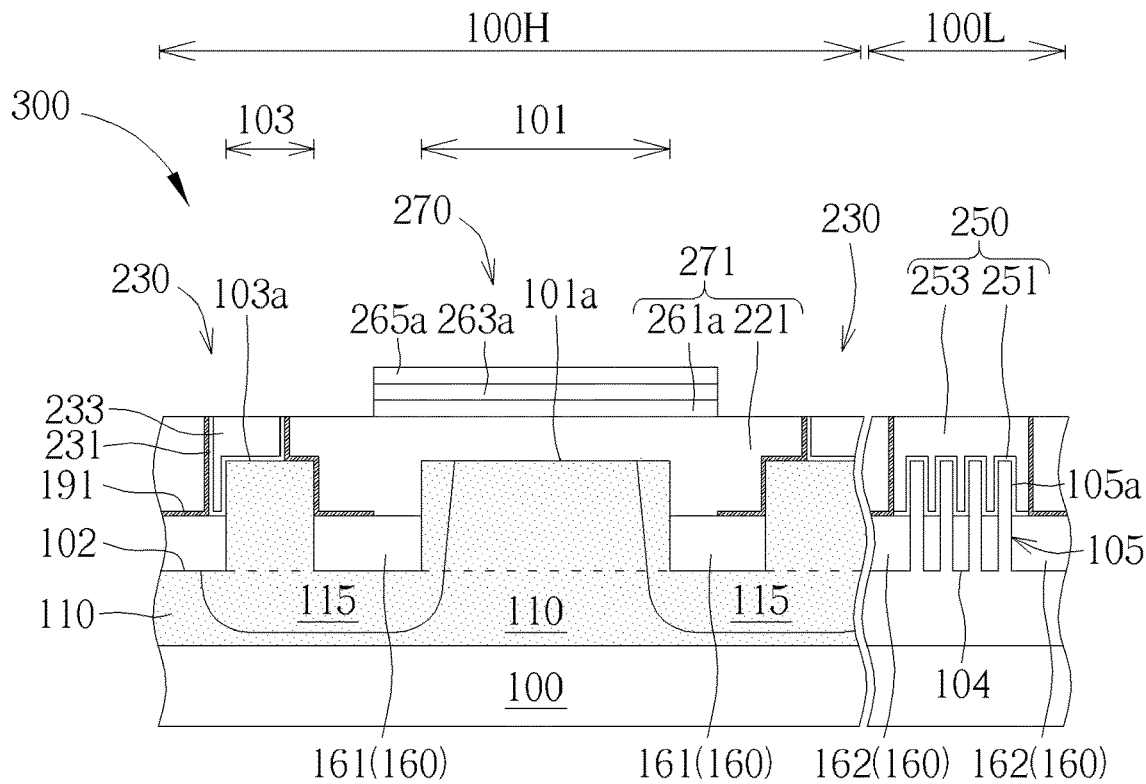

As shown in FIG. 9, a patterning process is then performed on the gate stack 260, to form a transistor 270. The transistor 270 includes a second dielectric layer 261a, a gate electrode 263a, and a capping layer 265a stacked from bottom to top, with each of the second dielectric layer 261a, the gate electrode 263a, and the capping layer 265a having vertically aligned sidewalls, and completely covering the active area 101 underneath in a vertical direction (not shown in the drawings) being perpendicular to the substrate 100. It is noted that, a portion of the first dielectric layer 221, namely the portion of the first dialectic layer 221 between the two transistors 230, is formed on the plane 101a at the top of the active area 101. Accordingly, the portion of the first dielectric layer 221, the second dielectric layer 261a may together form a gate dielectric layer 271 of the transistor 270, the gate electrode 263a is disposed on the gate dielectric layer 271, and the two active areas 103 at two sides of the gate electrode 263a may serve as the source/drain regions of the transistor 270, wherein the transistors 230 are disposed on the two active areas 103 respectively, and the source/drain regions are isolated from the active area 101 by the shallow trench isolation 161, as shown in FIG. 9. In other words, the gate dielectric layer 271 of the transistor 270 in the present embodiment includes a composite structure including the first dielectric layer 221 and the second dielectric layer 261a stacked sequentially on the plane 101a. It is noted that, the first dielectric layer 221 and the second dielectric layer 261a have different lengths respectively in a horizontal direction (not shown in the drawings) which is parallel to the substrate 100, so that, the two opposite sidewalls of the first dielectric layer 221 and the second dielectric layer 261a are not vertically aligned with each other. Also, the first dielectric layer 221 and the second dielectric layer 261a may have different thicknesses respectively, wherein a thickness T1 of the first dielectric layer 221 may be about 2 times to 4 times greater than a thickness T2 of the second dielectric layer 261a, and a ratio between the thickness T1 of the first dielectric layer 221 and the thickness T2 of the second dielectric layer 261a may be about 4:1 to 4:2, but is not limited thereto.

Furthermore, it is also noted that the high-voltage component of the present embodiment may further include a resistance structure (not shown in the drawings), for example a high resistant resistor (HiR) including a conductive layer and a capping layer stacked from bottom to top. People well skilled in the art should fully realize that, the formation of the resistance structure may be integrated with the formation of the transistor 270. For example, while patterning the gate stack 260, the gate electrode 263a disposed within the first region 100H and a resistance structure (not shown in the drawings) disposed within a resistance region may simultaneously be formed, so that, the conductive layer of the resistance structure and the gate electrode 263a of the transistor 270 may therefore include the same material like polysilicon or titanium nitride, and includes the same thickness, but not limited thereto. In another embodiment, the resistance structure may also be formed separately through additionally performing a photolithography and etching process either before or after forming the transistor 270, so that, the conductive layer of the resistance structure and the gate electrode 263a of the transistor 270 in the another embodiment may therefore include different materials and different thicknesses.

Through the aforementioned processes, the semiconductor device 300 of the first embodiment in the present disclosure is fabricated. According to the fabrication of the present embodiment, the active areas 101, 103 of the high-voltage component are simultaneously defined in a periphery region which is originally in use on forming an alignment marker, during defining the fin shaped structures 105. In this way, the fabrication of the fin field-effect transistor (namely the transistor 250) and the fabrication of the high-voltage component (namely, the transistor 270) may be successfully integrated under a simplified process flow. Furthermore, in the present embodiment, the high-voltage component, namely the transistor 270 includes the gate dielectric layer 271 with a composite structure, wherein a portion of the gate dielectric layer 271 (namely the portion of the first dielectric layer 221 disposed directly on the plane 101a) is embedded in the interlayer dielectric layer (namely, the first dielectric layer 221) of the semiconductor device 300. With these performances, although having a relative greater thickness, the gate dielectric layer 271 of the high-voltage component 270 may still be allowable to integrally formed within the structure of the fin field-effect transistor, with the top surfaces of the gate electrode 253 of the fin field-effect transistor 250 being flushed with the top surface of the portion of the gate dielectric layer 271. In this way, an obvious height difference possible occurred between the low-voltage component (for example the transistor 250) and the high-voltage component (for example the transistor 270) may be effectively avoided in the present embodiment, and the serious loading effective may also be sufficiently avoided thereby, to improve the function and the performance of the semiconductor device 300.

People well skilled in the art may easily realize the semiconductor device in the present disclosure is not limited to the aforementioned embodiment, and may further include other examples or variety under the practical product requirements. For example, in another embodiment, while performing the RMG process as shown in FIG. 7, the gate structure 180 may be optionally exposed only, and the gate dielectric layer 181 and the gate electrode 183 are then replaced by the gate dielectric layer 251 and the gate electrode 253. Following these, the gate structures 170 may be removed next, and the gate dielectric layer 171 and the gate electrode 173 are then replaced by a conductive material, so as to be configured as two source/drain contacts in directly contact with the two high-voltage doped regions 115 in the active areas 103 thereby. The following description will detail the different embodiments of the semiconductor device in the present disclosure. To simplify the description, the following will description detail the dissimilarities among the different embodiments and the identical features will not be redundantly described. In order to compare the differences between the embodiments easily, the identical components in each of the following embodiments are marked with identical symbols.

Figure 10:
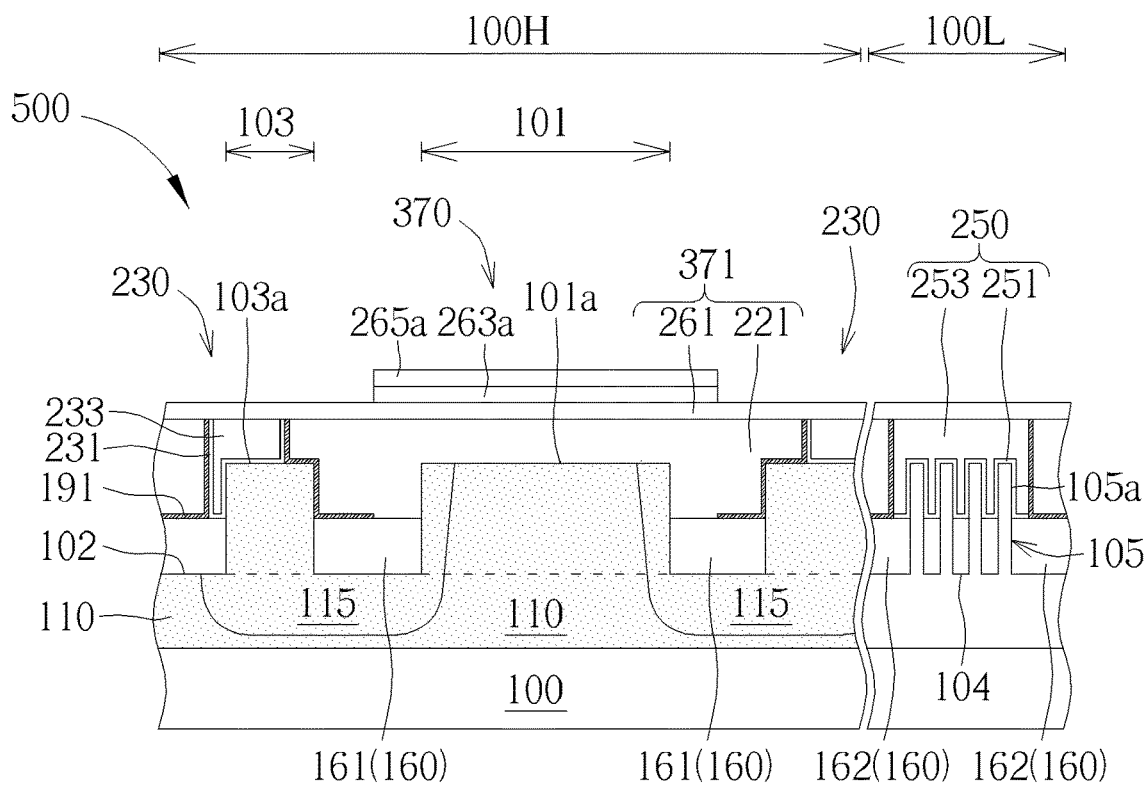
FIG. 10 illustrates a schematic diagram of a method of fabricating a semiconductor device according to a second embodiment of the present disclosure.

Please refer to FIG. 10, which is a schematic diagram of a method of fabricating a semiconductor device 500 according to the second embodiment of the present disclosure. The fabricating method of the present embodiment is substantially the same as that of the aforementioned embodiment, as shown in FIGS. 1-8, and all the similarities of the two embodiments will not be redundantly described hereinafter. The difference between the present embodiment and the aforementioned first embodiment is mainly in that the second dielectric layer 261 directly covers on the top surface of the gate electrode 253 of the transistor 250.

Precisely, while patterning the gate stack 260 in the present embodiment, the second dielectric layer 261 is used as an etching stop layer. Then, the second dielectric layer 261 of the present embodiment may be remained to still cover on the first dielectric layer 221 and the top surfaces of the transistors 230, 250, for protecting the important components such as the gate electrodes 233, 253 of the transistors 230, 250, underneath. In this way, a transistor 370 of the present embodiment may include the second dielectric layer 261, the gate electrode 263a and the capping layer 265a stacked from bottom to top, wherein the two opposite sidewalls of the gate electrode 263a and the capping layer 265a are vertically aligned with each other, and the two opposite sidewalls of the second gate dielectric layer 261 are not vertically aligned with the two opposite sidewalls of the gate electrode 263a and the capping layer 265a. Furthermore, in the present embodiment, the first dielectric layer 221 and the second dielectric layer 261 formed on the plane 101a may also form a gate dielectric layer 371 of the transistor 370, the gate electrode 263a is disposed on the gate dielectric layer 371, and the two active areas 103 at two sides of the gate electrode 263a may serve as the source/drain regions of the transistor 370, wherein the transistors 230 are disposed on the two active areas 103 respectively, and the two source/drain regions are isolated from the active area 101 by the shallow trench isolation 161, as shown in FIG. 10. Through these arrangements, the two opposite sidewalls of the first dielectric layer 221 may be vertically aligned with the two opposite sidewalls of the second dielectric layer 261, and the first dielectric layer 221 and the second dielectric layer 261 may include different thickness. The thickness T1 of the first dielectric layer 221 may be about 2 times to 4 times greater than the thickness T2 of the second dielectric layer 261, and a ratio between the thickness T1 of the first dielectric layer 221 and the thickness T2 of the second dielectric layer 261 may be about 4:1 to 4:2, but is not limited thereto.

Through the aforementioned processes, the semiconductor device 500 of the second embodiment in the present disclosure is fabricated. According to the fabrication of the present embodiment, the gate dielectric layer 371 is also partially embedded in the interlayer dielectric layer (namely, the first dielectric layer 221) of the semiconductor device 500, so that, a portion of the gate dielectric layer of the high-voltage component may be successfully integrated with the interlayer dielectric layer of the fin field-effect transistor. Then, the top surfaces of the gate electrode of the fin field-effect transistor may be flushed with the top surface of the portion of the gate dielectric layer, so as to prevent from the obvious height difference possibly occurred between the low-voltage components (for example the transistor 250) and the high-voltage components (for example the transistor 370), as well as the serious loading effective, to dramatically improve the function and the performance of the semiconductor device 500.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a high-voltage region and a low-voltage region;
   a first transistor disposed on the high-voltage region, the first transistor comprising:
      a first gate dielectric layer disposed on a first plane, wherein the first gate dielectric layer comprises a composite structure having a first dielectric layer and a second dielectric layer stacked from bottom to top; and
      a first gate electrode disposed on the first gate dielectric layer; and
   a second transistor on the low-voltage region, the second transistor comprising:
      a plurality of fin shaped structures protruded from a second plane on the substrate; and
      a second gate electrode disposed on the fin shaped structures to cross thereto, wherein the first dielectric layer covers sidewalls of the second gate electrode and a top surface of the first dielectric layer is even with a top surface of the second gate electrode.

2. The semiconductor device according to claim 1, wherein the second dielectric layer covers the top surface of the second gate electrode.

3. The semiconductor device according to claim 1, wherein sidewalls of the second dielectric layer are vertically aligned with sidewalls of the first gate electrode.

4. The semiconductor device according to claim 1, wherein the second gate electrode comprises a metal gate.

5. The semiconductor device according to claim 1, further comprising:

a contact etching stop layer disposed between the second gate electrode and the first dielectric layer, wherein the first dielectric layer covers the contact etching stop layer.

6. The semiconductor device according to claim 1, wherein the first plane is higher than the second plane and the first plane is even with top surfaces of the fin shaped structures.

7. The semiconductor device according to claim 1, further comprising:
   a plurality of shallow trench isolations disposed in the substrate, in the low-voltage region and in the high-voltage region respectively, wherein the shallow trench isolation in the low-voltage region and the shallow trench isolation in the high-voltage region comprise a same depth, and upper portions of the fin shaped structures are protruded from a top surface of the shallow trench isolation in the low-voltage region.

8. The semiconductor device according to claim 7, wherein the first transistor further comprises:
   two source/drain regions disposed in the substrate, and the shallow trench isolation in the high-voltage region is disposed between the first gate electrode and the two source/drain regions.

9. The semiconductor device according to claim 8, further comprising:
   two dummy gate electrodes disposed on the two source/drain regions respectively, wherein top surfaces of the two dummy gate electrodes are coplanar with the top surface of the first dielectric layer.

10. The semiconductor device according to claim 1, wherein a thickness ratio between the first dielectric layer and the second dielectric layer is 4:1 to 4:2.

* * * * *